US011540033B2

(12) United States Patent
Scheller et al.

(10) Patent No.: US 11,540,033 B2
(45) Date of Patent: Dec. 27, 2022

(54) TRANSPARENT SPEAKER FOR DISPLAYS, WINDOWS, AND LENSES

(71) Applicant: Meta Platforms Technologies, LLC, Menlo Park, CA (US)

(72) Inventors: Maik Andre Scheller, Redmond, WA (US); Jonathan Robert Peterson, Woodinville, WA (US); Morteza Khaleghimeybodi, Bothell, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 17/243,347

(22) Filed: Apr. 28, 2021

(65) Prior Publication Data
US 2022/0353592 A1 Nov. 3, 2022

(51) Int. Cl.
*H04R 1/02* (2006.01)
*H04R 17/00* (2006.01)
*H05K 5/00* (2006.01)

(52) U.S. Cl.
CPC ............. *H04R 1/021* (2013.01); *H04R 17/00* (2013.01); *H05K 5/0017* (2013.01)

(58) Field of Classification Search
CPC ....... H04R 1/021; H04R 17/00; H05K 5/0017
See application file for complete search history.

(56) References Cited

U.S. PATENT DOCUMENTS

| 4,352,961 A * | 10/1982 | Kumada | H04R 17/00 368/255 |
| 4,368,988 A * | 1/1983 | Tahara | G04G 13/00 968/968 |
| 8,879,766 B1 | 11/2014 | Zhang | |
| 2006/0010403 A1* | 1/2006 | Jeon | G06F 1/1688 715/864 |

(Continued)

FOREIGN PATENT DOCUMENTS

CN 210760467 U * 6/2020
WO 2017115010 A1 7/2017

OTHER PUBLICATIONS

Heywang, W., et al., Piezoelectricity: Evolution and Future of a Technology (Springer 2008), 576 pgs.

(Continued)

*Primary Examiner* — Mark Fischer
(74) *Attorney, Agent, or Firm* — McDermott Will & Emery LLP

(57) ABSTRACT

A transducer is described that includes a substrate configured to be deposited on a solid object, and a transparent medium coupled to the substrate and configured to oscillate at a pre-selected frequency upon receipt of an electrical excitation or a mechanical excitation and to provide a first acoustic wave. The transducer also includes an actuator configured to receive an electrical power, and to provide the electrical excitation or the mechanical excitation to the transparent medium, wherein at least a portion of the solid object is viewable through the transparent medium, and the (Continued)

first acoustic wave is at least partially transmitted through an interface of the transparent medium. A system and a non-transitory, computer-readable medium storing instructions to cause the system to perform a method to use the transducer for generating acoustic waves in a transparent medium are also disclosed.

16 Claims, 11 Drawing Sheets

(56) References Cited

U.S. PATENT DOCUMENTS

| | | | |
|---|---|---|---|
| 2013/0272557 A1* | 10/2013 | Ozcan | H04M 1/0266 381/333 |
| 2014/0062261 A1 | 3/2014 | Yamamoto et al. | |
| 2015/0023138 A1 | 1/2015 | Liu et al. | |
| 2015/0372219 A1 | 12/2015 | Yamashita et al. | |
| 2016/0025669 A1 | 1/2016 | Sun et al. | |
| 2016/0270656 A1* | 9/2016 | Samec | G16H 40/63 |
| 2016/0316301 A1 | 10/2016 | Chen | |
| 2017/0366898 A1* | 12/2017 | Melanson | H04R 1/04 |
| 2019/0297416 A1* | 9/2019 | Deng | H04S 7/303 |

OTHER PUBLICATIONS

Koruza, J., "Transparent crystals with ultrahigh piezoelectricity," Nature, vol. 577, Jan. 16, 2020, pp. 325-326.

Qui, C., et al., "Transparent ferroelectric crystals with ultrahigh piezoelectricity," Nature, vol. 577, Jan. 16, 2020, pp. 350-354 (plus added methods)—18 pgs.

Park, Seung-Eek, et al., "Ultrahigh strain and piezoelectric behavior in relaxor based ferroelectric single crystals," J. Appl. Phys., 82(4) Aug. 15, 1997, pp. 1804-1811.

Zhang, S., et al., "Advantages and challenges of relaxor-PbTiO(3) ferroelectric crystals for electroacoustic transducers—A review," Progress in Materials Science, 68 (2015) pp. 1-66.

EPO: International Search Report and Written Opinion for International Application No. PCT/US2022/026545, dated Jul. 26, 2022, 17 pages.

* cited by examiner

TRANSPARENT SPEAKER FOR DISPLAYS, WINDOWS, AND LENSES

BACKGROUND

Field

Embodiments as disclosed herein are related to the field of transparent acoustic transducers for use in optical components and devices. More specifically, embodiments as disclosed herein are related to transparent acoustic transducers for use in displays, windows, lenses, for aesthetically pleasing results on opaque containers and boxes, and for use in vehicles.

Related Art

Some applications use transparent membranes to activate acoustic modes in flat screen displays to generate audio signals accompanying the image display. However, the amplitude of the oscillations of the flat screen necessary to produce a loud enough audio signal tends to interfere with the quality of the image display, especially for low acoustic frequency having long standing wavelengths on the display. Moreover, the need for actuators capable of operating at high voltages, especially at the higher frequencies of the audible spectrum (let alone ultrasound applications), hinders the applicability of such techniques in compact devices (e.g., smart frames and mixed reality headsets).

SUMMARY

In a first embodiment, a transducer is described that includes a substrate configured to be deposited on a solid object, and a transparent medium coupled to the substrate and configured to oscillate at a pre-selected frequency upon receipt of an electrical excitation or a mechanical excitation and to provide a first acoustic wave. The transducer also includes an actuator configured to receive an electrical power, and to provide the electrical excitation or the mechanical excitation to the transparent medium, wherein at least a portion of the solid object is viewable through the transparent medium, and the first acoustic wave is at least partially transmitted through an interface of the transparent medium.

In a second embodiment, a device is described that includes a frame, a display mounted on the frame, the display comprising a substrate configured to be deposited on a solid object, and a power circuit configured to provide an electrical power. The device also includes an actuator configured to receive the electrical power, and to provide an electrical excitation or a mechanical excitation, and a transducer. The transducer includes a transparent medium coupled to the substrate and configured to oscillate at a pre-selected frequency in response to the electrical excitation or mechanical excitation, to provide a first acoustic wave, wherein at least a portion of the solid object is viewable through the transparent medium, and the first acoustic wave is at least partially transmitted through an interface of the transparent medium.

In yet another embodiment, a non-transitory, computer-readable medium stores instructions which, when executed by a processor, cause a computer to perform a method. The method includes filtering an electrical power to an electrode coupled to a transparent medium in a transducer to select a pre-determined frequency for an electrical excitation or a mechanical excitation of the transparent medium. The method also includes providing the electrical excitation or the mechanical excitation to generate a propagating acoustic wave from an interface in the transparent medium at the pre-determined frequency, directing the propagating acoustic wave in a pre-selected direction, and receiving an incoming propagating acoustic wave from the pre-selected direction in the interface of the transparent medium.

A system is also described. The system includes a means for storing instructions and a means for executing the instructions to cause the system to perform a method. The method includes filtering an electrical power to an electrode coupled to a transparent medium in a transducer to select a pre-determined frequency for an electrical excitation or a mechanical excitation of the transparent medium. The method also includes providing the electrical excitation or the mechanical excitation to generate a propagating acoustic wave from an interface in the transparent medium at the pre-determined frequency, directing the propagating acoustic wave in a pre-selected direction, and receiving an incoming propagating acoustic wave from the pre-selected direction in the interface of the transparent medium.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

In the figures, like reference numerals refer to features and elements having like descriptions, except when indicated otherwise.

DETAILED DESCRIPTION

Figure 1:
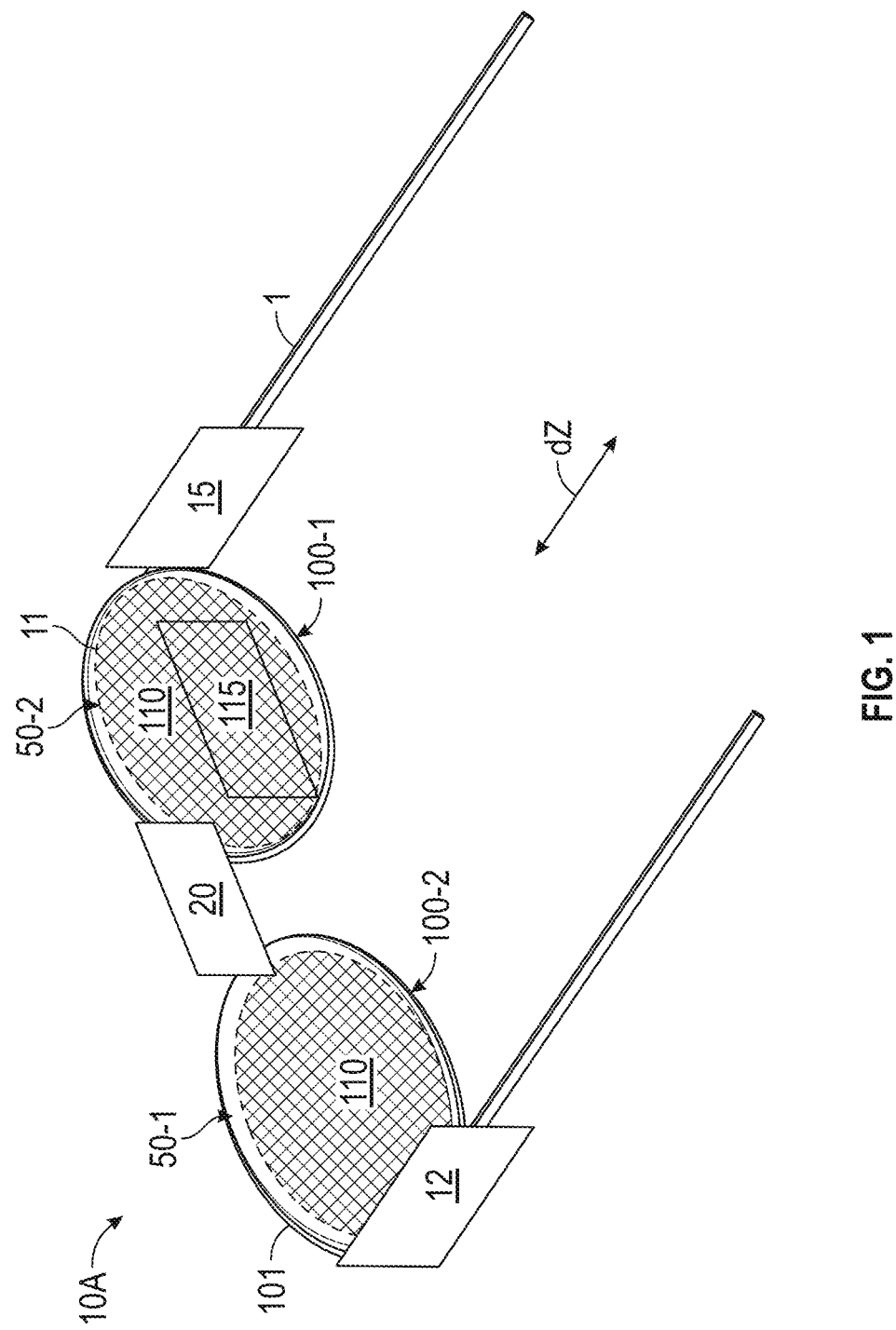
FIG. 1 illustrates a mixed reality device including eyeglasses and a transparent speaker, according to some embodiments.

In the following detailed description, numerous specific details are set forth to provide a full understanding of the present disclosure. It will be apparent, however, to one ordinarily skilled in the art, that the embodiments of the present disclosure may be practiced without some of these specific details. In other instances, well-known structures and techniques have not been shown in detail so as not to obscure the disclosure.

More than 1 billion speakers in consumer devices, other electronics, public broadcast systems, and other products are sold every year. A transparent speaker would offer many implementation possibilities, in particular in the field of augmented reality (AR) and virtual reality (VR) headsets and smart frame devices, as sufficiently loud speakers may be realized at a light weight with small mass and volume. More generally, embodiments as disclosed herein are directed to transparent acoustic transducers including audio speakers and microphones, ultrasound emitters and sensors, and the like, implemented an optical substrate for use with imaging and vision devices.

In addition, embodiments as disclosed herein include transparent acoustic transducers implemented on optical substrates for use in home windows, car windows, and other indoor or outdoor architectural applications. Architectural and other window applications offer the convenience of having essentially a free form-factor to design an acoustic transducer having the intensity and the accuracy desired for any given application. Moreover, embodiments as disclosed herein include software applications to control transparent transducers as above and provide sensing, detection, ranging, and beaming features to one or more propagating acoustic waves for a desired purpose.

A transparent medium used for an acoustic transducer as disclosed herein may include a membrane or a transparent piezo-electric material. In some embodiments, the membrane includes a transparent organic material, a transparent inorganic material, or any combination of the above. In some embodiments, the transparent organic materials may include a polymer such as Polyvinylidene difluoride (PVDF), ultra-high molecular weight Polyethylene, and the like. Transparent piezo materials are used e.g., in liquid lenses to create variable optical focal powers for AR/VR devices. In some embodiments, the transparent piezo materials may include ceramics such as PMN-PT (tetragonal, electrostrictive, AC poled), Lanthanum nickelate (LNO), Lithium titanate (LTO), in combination with transparent conductive layers such as indium tin oxide, and the like. Other forms of variable lenses are based on transparent membranes driven by edge positioned piezo or electrostatic. In embodiments as disclosed herein, membranes made of transparent piezo material (or other transparent materials) are driven by edge positioned actuators with a frequency range within the human audible spectrum with a variable frequency and amplitude, e.g., between 10 to 140 dB sound pressure level (SPL) to produce sound waves containing information like music, voices, alarms, alerts, and the like. Due to the transparency of membranes and piezoelectric layers as disclosed herein, acoustic transducers as disclosed herein can be implemented in windows, screens of monitors, TVs, cell phones, AR/VR devices, eyeglasses, or other products. It is power efficient due to the piezo or electrostatic movement and can be anti-reflective coated for transparency improvement. In some embodiments, a power circuit provides a voltage amplitude (>50V) to generate acoustic waves of sufficient amplitude to be heard by humans at selected distances.

In embodiments as disclosed herein, a transparent medium includes materials having at least some transmissivity (greater than 0% and up to 100%) for light in the visible spectrum (e.g., from about 400 to about 750 nm), in the infrared spectrum (mostly between 900 nm and 25 um) or any portion of the visible and infrared spectra, or combination thereof.

The transparent medium includes an interface with the environment that oscillates to generate acoustic waves that propagate through the environment (e.g., the atmosphere, air, other gases, liquids, plasmas, or even a solid material). Embodiments as disclosed herein provide the advantage of ubiquitous applications as the transparent medium may be embedded in a window (architectural, indoors/outdoors, vehicle), a screen of a display, or a traffic sign and the like.

In some embodiments, the optical substrate may have a dedicated shape or profile (e.g. the curved surface of a lens, a prism, a reflector, a diffraction grating, and the like) configured to provide an image to the user of the headset, smart frame, or any other optical device. Embodiments as disclosed herein exploit the advantage of implementing rapid acoustic oscillations in the transparent medium (typically much higher than 60 Hz), such that any effect in the deformation of the optical substrate by the oscillations of the transparent medium may be averaged out and undetectable for the user.

FIG. 1 illustrates a mixed reality device 10A including eyeglasses 50-1 and 50-2 (hereinafter, collectively referred to as "eyeglasses 50"), and transparent speakers 100-1 and 100-2 (hereinafter, collectively referred to as "transparent speakers 100"), according to some embodiments. A frame 1 supports eyeglasses 50. Mixed reality device 10A may include an augmented reality (A/R) device, or a virtual reality (V/R) device having a display 115 mounted on frame 1. Display 115 may include an optical substrate 11 configured to provide an image (e.g., through display 115 or eyeglasses 50). In some embodiments, images for display 115 may be provided by processor circuit 20, executing instructions stored in memory circuit 12. A power circuit 15 provides electrical power to an actuator 101. In some embodiments, power circuit 15 is controlled by processor circuit 20 executing instructions stored in memory circuit 12. In some embodiments, power circuit 15 may include a high voltage optical transformer (HVOT) that is compact and cost efficient to enable more application in the VR/AR space. Actuator 101 receives the electrical power and provides an electrical excitation or a mechanical excitation to transparent speakers 100.

Transducer 100 includes a transparent medium 110 coupled to optical substrate 11 and configured to oscillate based on the frequency and amplitude of the signal received from the processor and the digital signal processing (DSP) unit in response to the electrical excitation or mechanical excitation. In some embodiments, transparent medium 110 includes a transparent membrane, or a layer of transparent piezoelectric material. In some embodiments, transparent medium 110 may include an anti-reflective coating for optical transparency improvement at least in a selected portion of the visible spectrum. Acoustic waves produced by the oscillation of transparent medium 110 may operate in an audible spectral range, e.g., from about 20 Hz to about 20 kHz or in the ultrasonic range (>20 kHz, up to hundreds of kHz, or even one Megahertz, 1 MHz=$10^6$ Hz). More specifically, in some embodiments, the frequency of acoustic waves generated may be in the range of 1 Hz to 100 kHz. In some embodiments, the amplitude of the acoustic waves is in the range of 10 to 140 dB SPL.

Transparent medium 110 is moved by actuator 101 for a displacement, dZ, to create acoustic waves at least partially transmitted through an interface of transparent medium 110. In some embodiments, at least a portion of the image is transmitted through transparent medium 110. In some embodiments, the displacement dZ is a linear displacement along a direction substantially perpendicular to the interface of transparent medium 110 (e.g., along the plane of eyeglasses 50).

Figure 2:
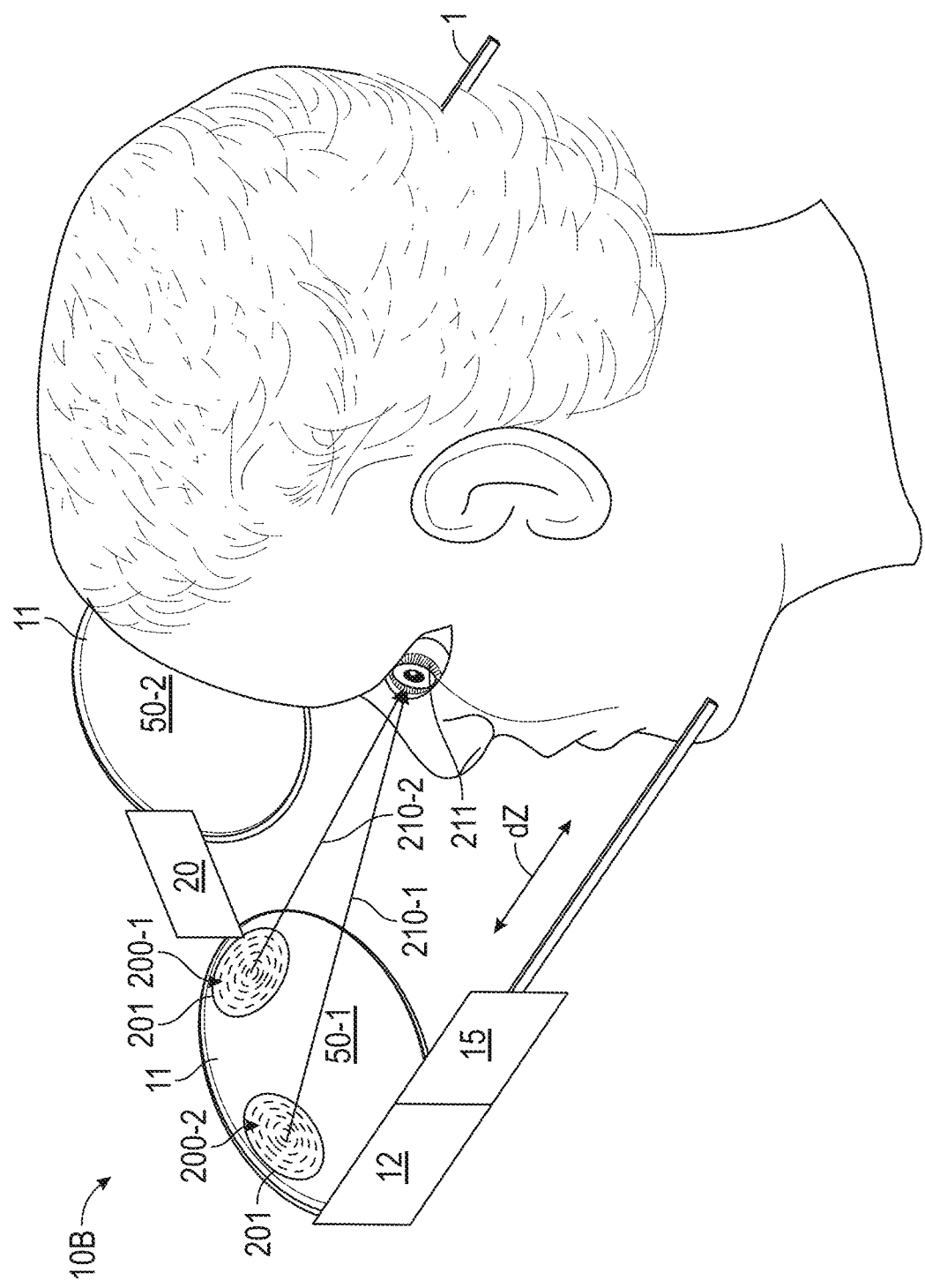
FIG. 2 illustrates a smart frame device including two transparent ultrasound emitters, according to some embodiments.

FIG. 2 illustrates a smart frame 10B including two transparent ultrasound emitters 200-1 and 200-2 (hereinafter, collectively referred to as "ultrasound emitters 200"), according to some embodiments. Memory circuit 12, power circuit 15, and processor circuit 20 are as described above in reference to mixed reality device 10A. Frame 1 and eyeglasses 50-1 and 50-2 are also as described above, except in this case eyeglasses 50 may only include an optical substrate 11 without a display. Accordingly, smart frame device 10B may work optically as a regular eyeglass piece for a user 40. In some embodiments, processor circuit 20 may execute instructions to direct power circuit 15 to provide an electronic excitation or a mechanical excitation via an actuator 201, to ultrasound emitters 200. Because ultrasound emitters 200 include a transparent medium (e.g., a membrane or transparent piezoelectric layers), embodiments as disclosed herein can make use of any number of them across the interface of one of the two eyeglasses 50, without interfering with the optical performance of smart frame 10B.

Ultrasound emitters 200 generate acoustic waves 210-1 and 210-2 (hereinafter, collectively referred to as "acoustic waves 210") which, when they have a pre-determined relative phase, create an ultrasonic beam 211 that may be scanned over the face of user 40. Ultrasonic beam 211 may be used to perform a depth measurement and obtain a three-dimensional (3D) representation of the face of user 40. The choice of the number, position, area, and shape of ultrasound emitters 200 may be selected to accommodate a desired direction, intensity, and frequency of ultrasonic beam 211 via instructions in memory circuit 12, processor circuit 20, and actuator 201. In some embodiments, ultrasonic beam 211 may be used to scan the eye of user 40 and determine, by retrieving the precise shape of the surface of the eye, a position or direction of the eye pupil.

In some embodiments, ultrasonic beam 211 may be use more generally in biometrics identification of individuals. Accordingly, every individual have unique 3D geometries of face, eyes, nose (very much like fingerprint), and the relative proportions thereof. Thus, in some embodiments ultrasonic beam 211 may collect information facial biometric information that can be used to infer if the person who is wearing the device is indeed the owner of the device. Accordingly, if the user is properly identified, the device may be unlocked.

Figure 3A:
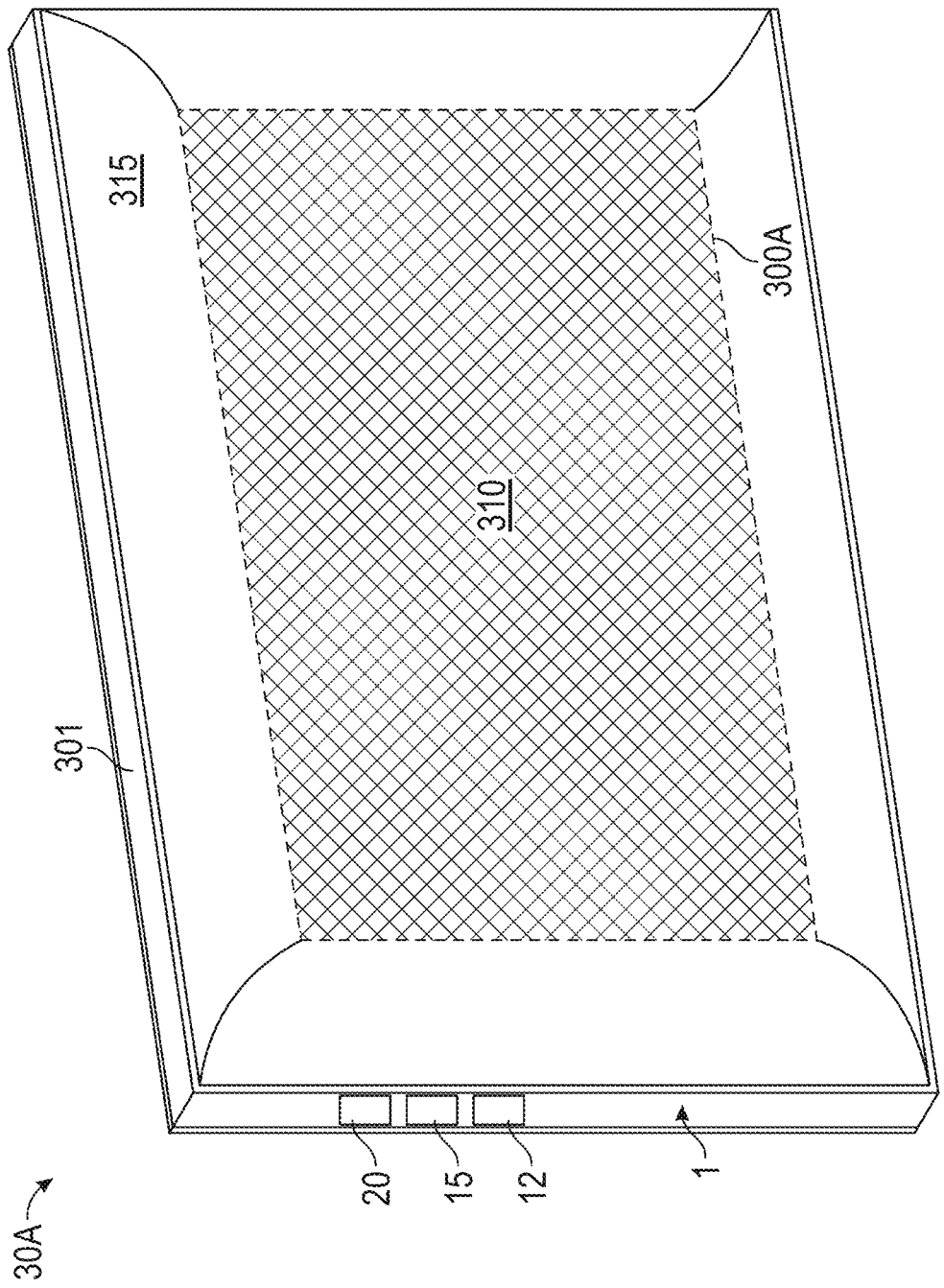
FIGS. 3A-3B illustrate a television display including a transparent speaker, according to some embodiments.
Figure 3B:
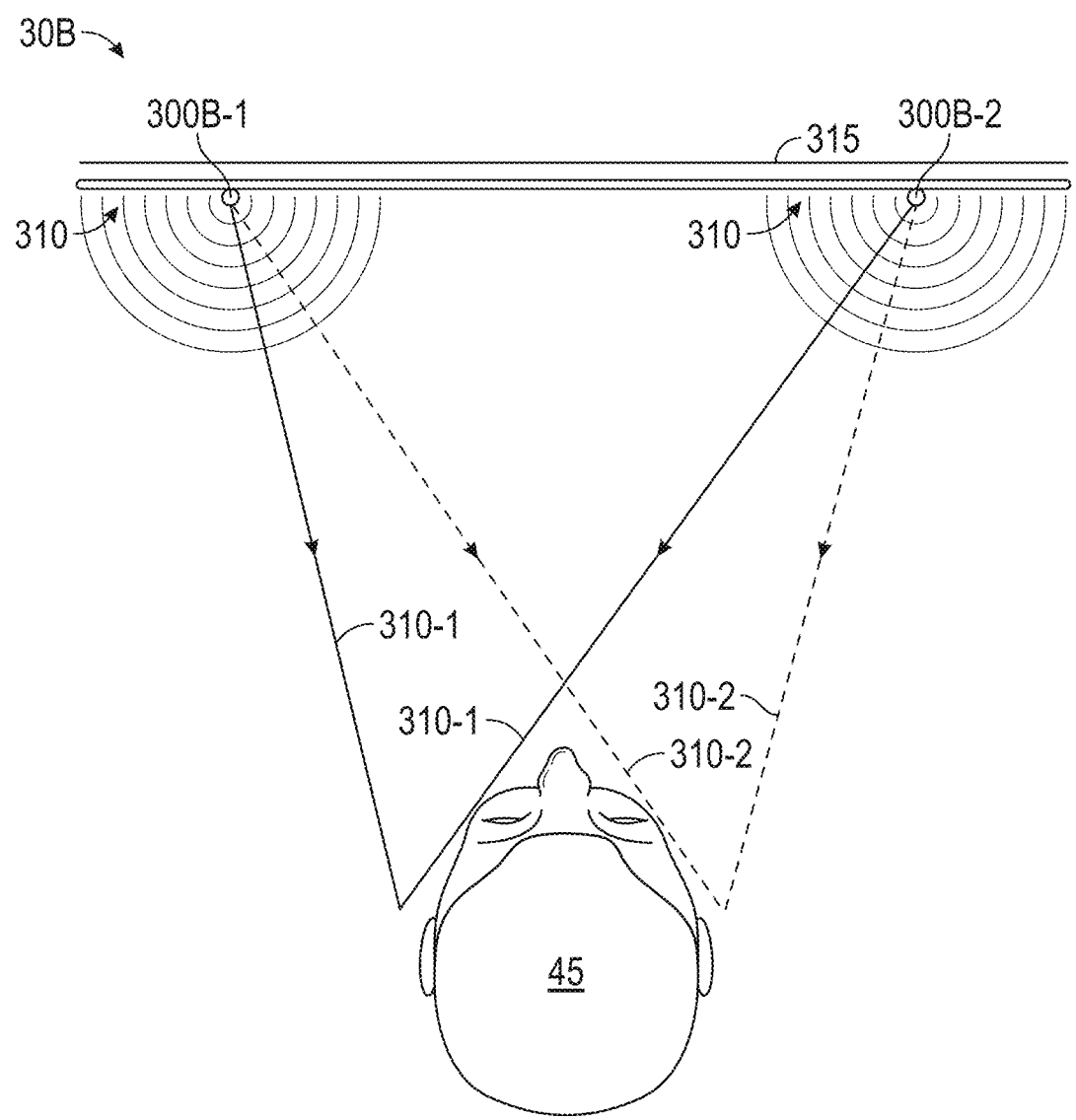

FIGS. 3A-3B illustrate television displays 30A and 30B (hereinafter, collectively referred to as "TV displays 30") including transparent speakers 300A, 300B-1, and 300B-2 (hereinafter, collectively referred to as "transparent speakers 300"), according to some embodiments. Memory circuit 12, power circuit 15, and processor circuit 20 are as described above in reference to mixed reality device 10A and smart frame 10B. Transparent speakers 300 include a transparent medium 310 that induced to oscillate by receiving an electrical excitation or a mechanical excitation from an actuator 301, which may be mounted (together with a display 315), on a frame 1, and powered by a power circuit 15. Consistent with the present disclosure, transparent medium 300 may include a transparent membrane (e.g., including an organic or inorganic material) or a transparent layer of a piezoelectric material.

The induced oscillations of transparent medium 300 produce propagating acoustic waves through a surface of display 315 in contact with air. In some embodiments, transparent speakers 300B-1 and 300B-2 may be directed to produce propagating acoustic waves having a relative phase adjusted to produce two acoustic beams 310-1 and 310-2 (hereinafter, collectively referred to as "acoustic beams 310") directed to each ear of a user 45. Accordingly, display 30B may provide a stereophonic experience for user 45. Consistent with the present disclosure, the relative phase between the acoustic waves produced by transparent speakers 300B may be adjusted by processor circuit 20 upon executing instructions stored in memory circuit 12. While display 30B includes two transparent speakers 300B, this is not limiting of the number, disposition and size of transparent speakers that may be used in TV displays 30.

The digital control over acoustic beams 310 through processors circuit 20 enables the use of time-sequenced alternating patterns wherein, in a train of pulses provided to transparent speakers 300B, some pulses may be directed through beam 310-1 and other pulses may be directed through beam 310-2. The timing pattern may be adjusted at a frequency such that user 45 perceives acoustic beams 310 simultaneously, in a "synchronous" experience.

Figure 4A:
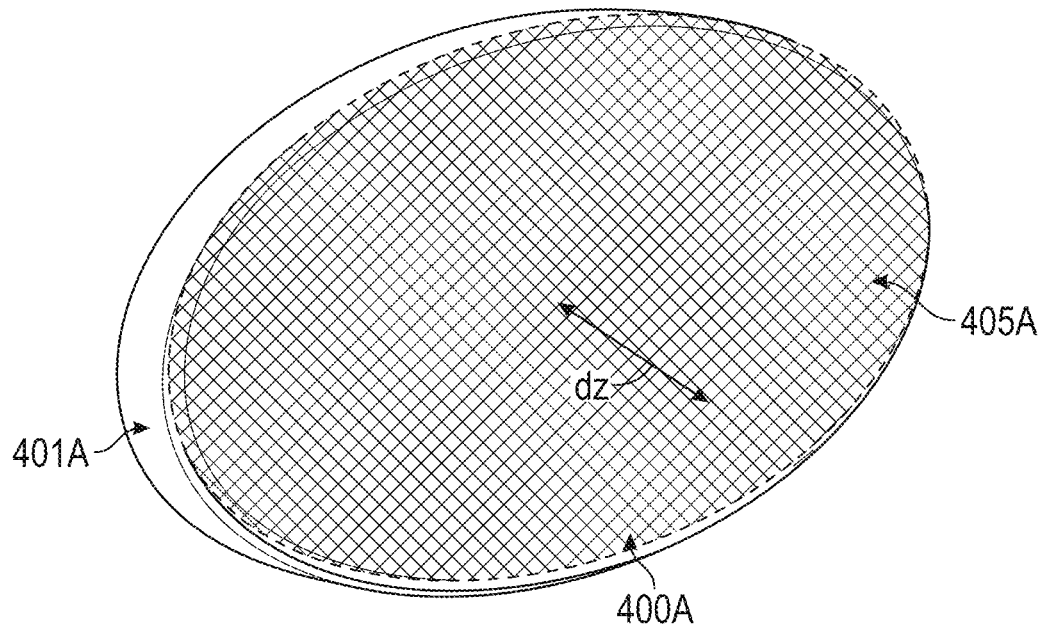
FIGS. 4A-4B illustrate eyeglasses including an electrode for providing an electrical excitation or a mechanical excitation to a transparent substrate in the eyeglasses, according to some embodiments.
Figure 4B:
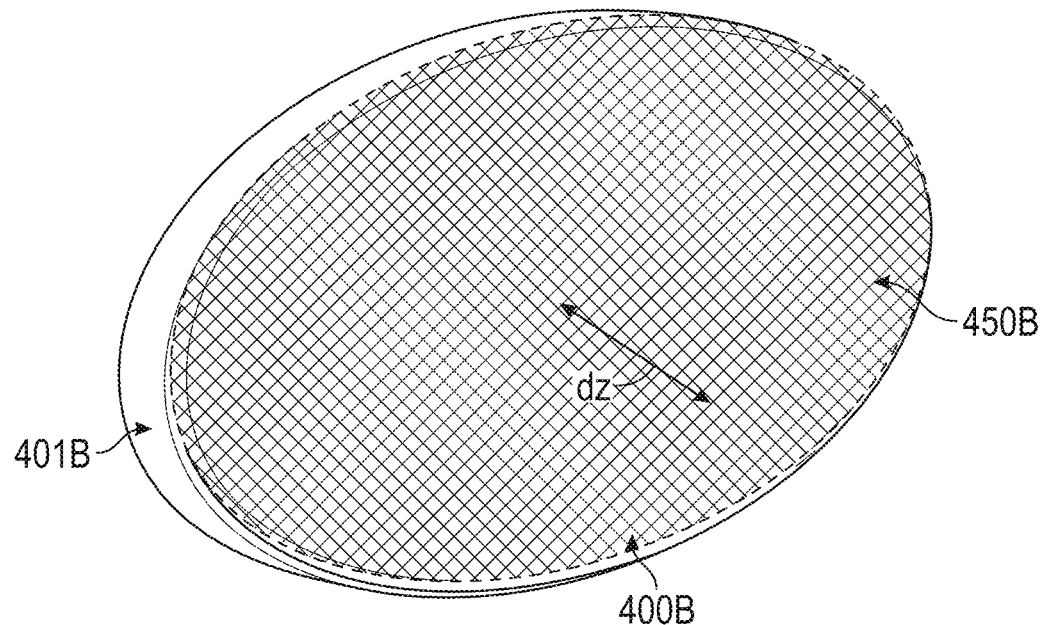

FIGS. 4A-4B illustrate eyeglasses 450A and 450B (hereinafter, collectively referred to as "eyeglasses 450") including actuators 401A and 401B (hereinafter, collectively referred to as "actuators 401") for providing an electrical excitation or a mechanical excitation to transparent substrates 400A and 400B (hereinafter, collectively referred to as "transparent substrates 400") in eyeglasses 450, according to some embodiments. Substrate 400A may include a transparent membrane and substrate 400B may include a transparent piezoelectric layer.

Substrates 400 are moved through actuators 401. In some embodiments, actuators 401 are edge-positioned actuators that produce a displacement, dZ, substantially perpendicular to an interface of substrate 400A with the medium in which eyeglasses 450 are embedded. The oscillatory displacement of substrates 400 creates an acoustic wave that propagates through the medium. The medium through which the acoustic wave propagates may be air, any other gas, a liquid, or any other fluid.

Figure 5:
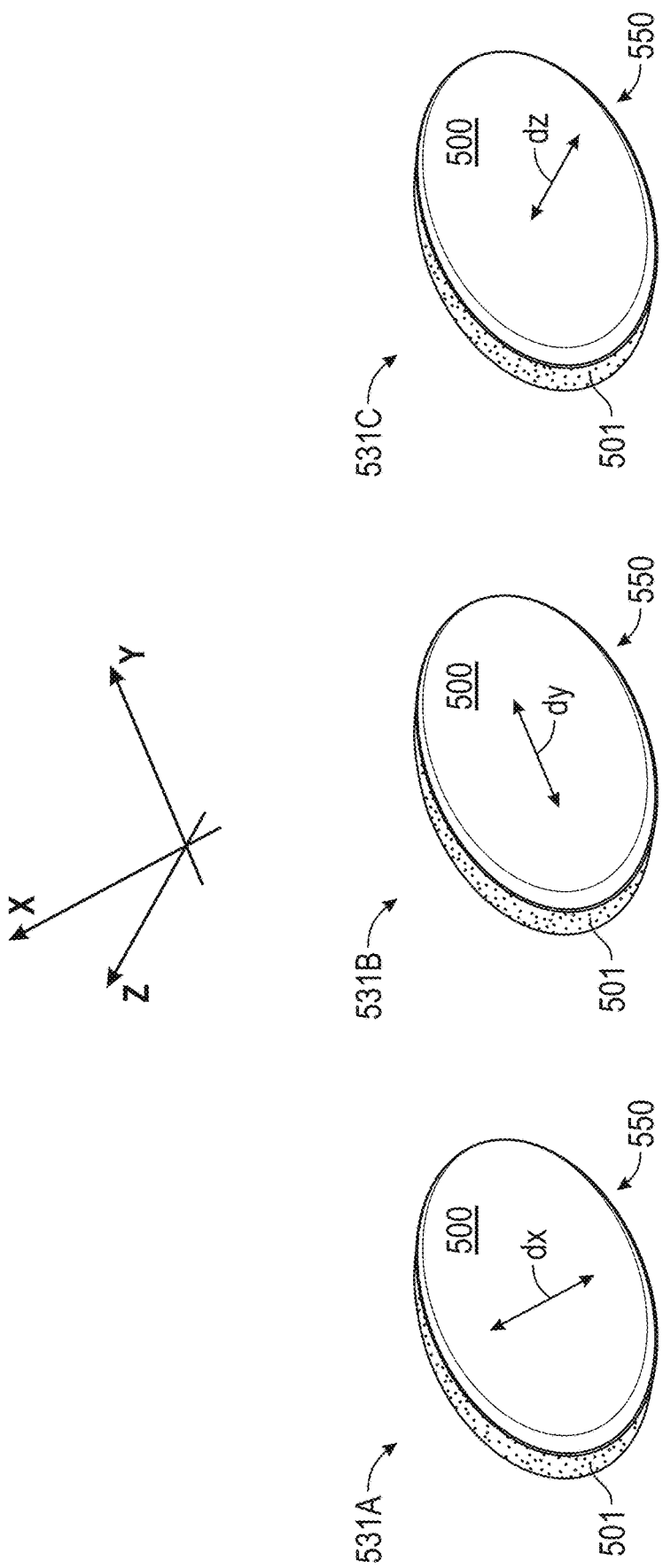
FIG. 5 illustrates different oscillation modes of a transparent substrate in an eyeglass, according to some embodiments.

FIG. 5 illustrates different oscillation modes 531A, 531B, and 531C (hereinafter, collectively referred to as "oscillation modes 531") of a transparent substrate 500 in an eyeglass 550, according to some embodiments. A Cartesian reference frame XYZ is illustrated to facilitate the understanding of the disclosure, but is not intended to be limiting in any aspect as to the orientation, arrangement, and configuration of the disclosed features. Accordingly, without limitation and for illustrative purposes only, transparent substrate 500 may be assumed to lay in the XY-plane of the Cartesian reference frame.

Oscillation modes 531 may be selected by configuring the excitation provided to transparent substrate 500 by an actuator 501. Each of oscillation modes 531 can have a different frequency response and a different loudness curve that may be exploited to the advantage of the user by electronically adjusting the electrical power provided to actuator 501. For example, in some embodiments, the frequency, phase, and direction of one or more electrical signals to actuator 501 may be controlled via software instructions stored in a memory circuit and executed by a processor circuit as disclosed herein.

In some embodiments, modes 531A and 531B may result from displacements induced in transparent substrate 500 (e.g., a piezoelectric layer) perpendicularly (along the X-axis or Y-axis, respectively) to an electric field, E, applied by actuator 501 (e.g., E along the Z-axis). In mode 531C, the direction of the oscillation of the piezoelectric layer may be parallel to the electric field (e.g., along the Z-axis).

Figure 6:
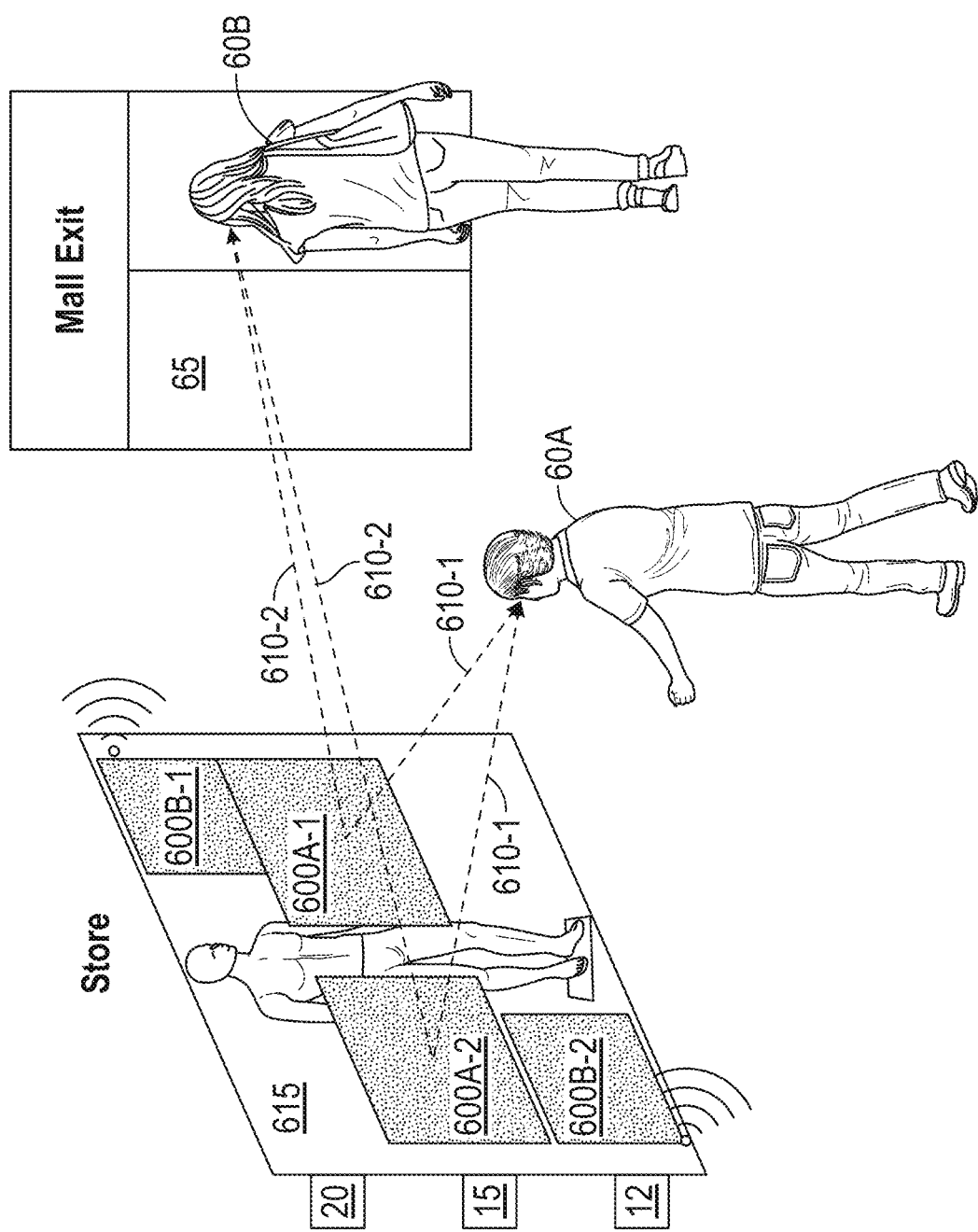
FIG. 6 illustrates a transparent speaker in a store window inside a mall, according to some embodiments.

FIG. 6 illustrates transparent speakers 600A-1 and 600A-2 (hereinafter, collectively referred to as "transparent speakers 600A") in a store window 615 inside a mall 65, according to some embodiments. In some embodiments, store window 615 may also include transparent ultrasonic transducers 600B-1 and 600B-2 (hereinafter, collectively referred to as "ultrasonic transducers 600B"). Memory circuit 12 stores instructions to be executed by processor circuit 20 to cause transparent speakers 600A to operate as disclosed herein. In addition, power circuit 15 provides the electrical power to memory circuit 12, processor circuit 20, and transparent speakers 600A.

Two shoppers 60A and 60B (hereinafter, collectively referred to as "shoppers 60"), move outside of the store, in different directions relative to store window 615. The displacement (e.g., direction, distance, and speed) of shoppers 60 may be detected by transparent ultrasonic transducers 600B. Based on the displacement of shoppers 60, transparent speakers 600A may be configured by software instructions executed by processor circuit 20 to direct an acoustic beam 610-1 to shopper 60A and an acoustic beam 610-2 to shopper 60B. In some embodiments, and given the different compulsion of shoppers 60, acoustic beams 610 may be directed in different directions, and also include a different sound message to shoppers 60A and 60B. For example, on noticing that shopper 60B is headed for the mall exit, acoustic beam 610-2 may include a farewell and thank you message. And noticing that shopper 60A is headed towards shopping window 615, acoustic beam 610-1 may include an enticing message.

Figure 7A:
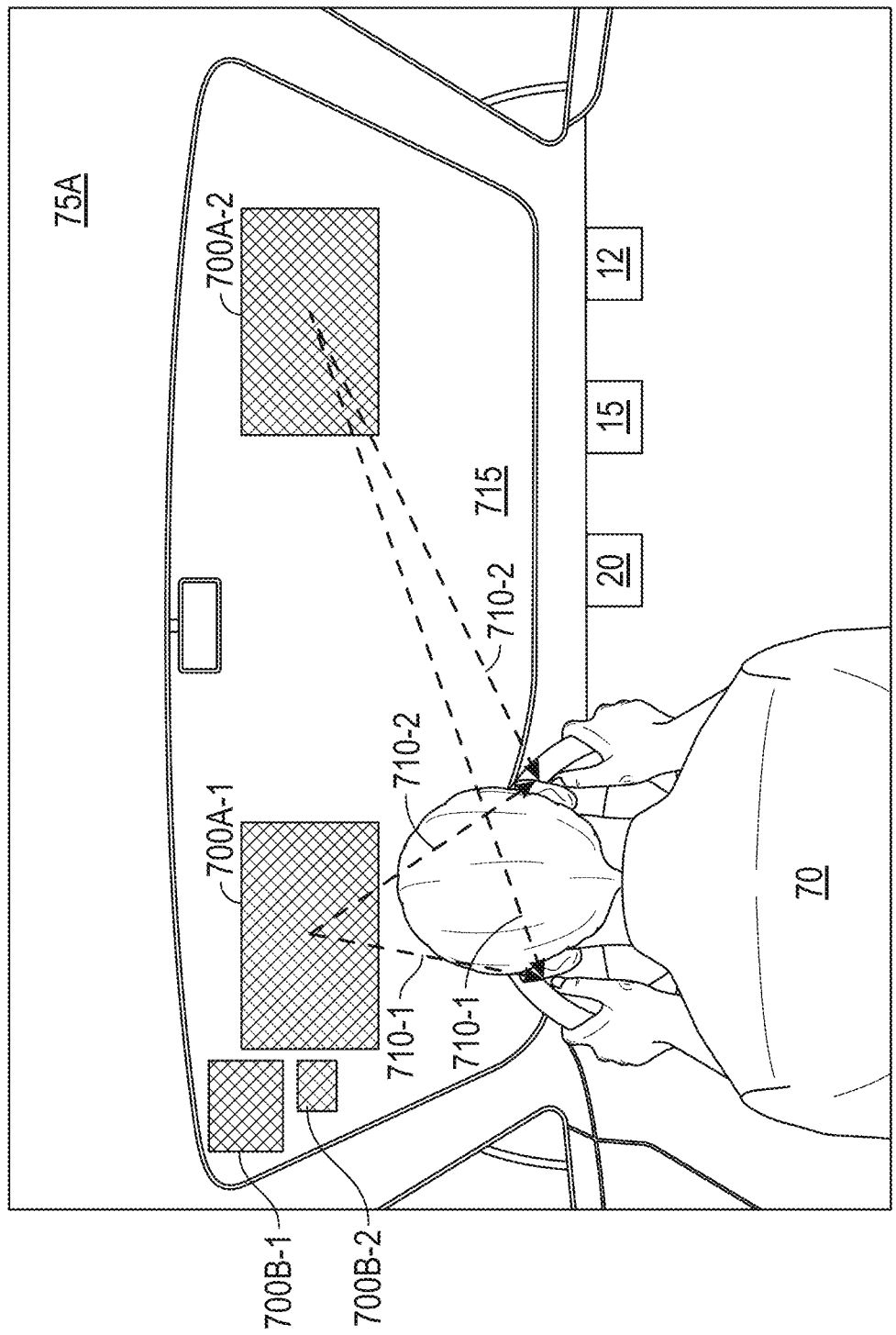
FIGS. 7A-7B illustrate transparent speakers and ultrasonic transducers in car windows, according to some embodiments.
Figure 7B:
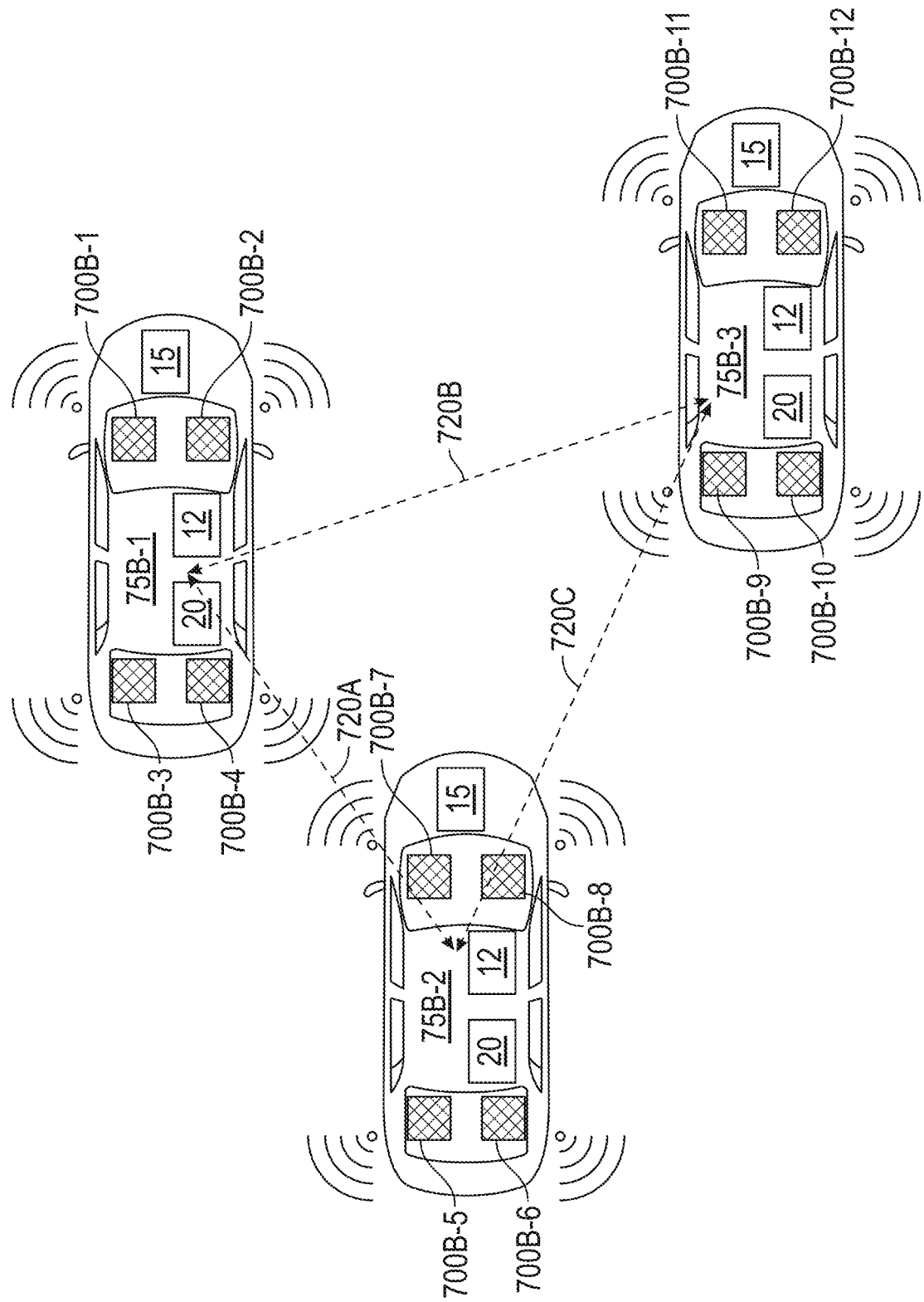

FIGS. 7A-7B illustrate transparent speakers 700A-1 and 700A-2, (hereinafter, collectively referred to as "transparent speakers 700A"), and transparent ultrasonic transducers 700B-1, 700B-2, 700B-3, 700B-4, 700B-5, 700B-6, 700B-7, 700B-8, 700B-9, 700B-10, 700B-11, and 700B-12 (hereinafter, collectively referred to as "transparent ultrasonic transducers 700B") in car windows, according to some embodiments. Memory circuit 12 stores instructions to be executed by processor circuit 20 to cause transparent speakers 700A and transparent ultrasonic transducers 700B to operate as disclosed herein. In addition, power circuit 15 provides the electrical power to memory circuit 12, processor circuit 20, transparent speakers 700A, and transparent ultrasonic transducers 700B.

The ability of adding a transparent substrate as disclosed herein within the large area of car windows provides an opportunity to use the technology disclosed herein for handling audio signals to the occupants of a car 75A at a desired volume and with added stereophonic features. Also, the use of transparent substrates as disclosed herein in car windows may further expand the use of ultrasound sensors for accurately determining the relative positions of cars 75B-1, 75B-2, and 75B-3, in traffic or stationary.

FIG. 7A illustrates a driver 70 of a car 75A wherein a windshield 715 includes transparent speakers 700A. In some embodiments, two transparent speakers 700A are combined to generate acoustic beams 710-1 and 710-2 (hereinafter, collectively referred to as "acoustic beams 710"), directed to each ear of driver 70. Accordingly, transparent speakers 700A may provide a stereophonic audio signal to driver 70. In addition, transparent ultrasonic transducers 700B-1 and 700B-2 may be configured to scan the face and the eyes of driver 70, and determine an acuity and attention of the driver on the road ahead. For example, in some embodiments, upon determining that driver 70 is getting drowsy, falling asleep, or simply not paying attention to the road ahead, processor circuit 20 may direct transparent speakers 700A to provide a loud alert to driver 70.

FIG. 7B illustrates cars 75B-1, 75B-2, and 75B-3 (hereinafter, collectively referred to as "cars 75B") equipped with transparent ultrasonic transducers 700B in one or more windows, as disclosed herein. Using transparent ultrasonic transducers 700B, cars 75B may accurately and quickly determine the relative positions 720A, 720B, and 720C (hereinafter, collectively referred to as "relative positions 720") between the cars. The use of transparent substrates as disclosed herein enables the implementation of multiple, large area ultrasonic sensors that may have a longer reach and more accuracy to pinpoint relative positions 720. In some embodiments, cars 75B may also include transparent speakers inside the car (e.g., transparent speakers 700A), which may be instructed by processor circuit 20 to alert the driver of any dangerous proximity of another car, a pedestrian, or any other obstacle in the road.

Figure 8:
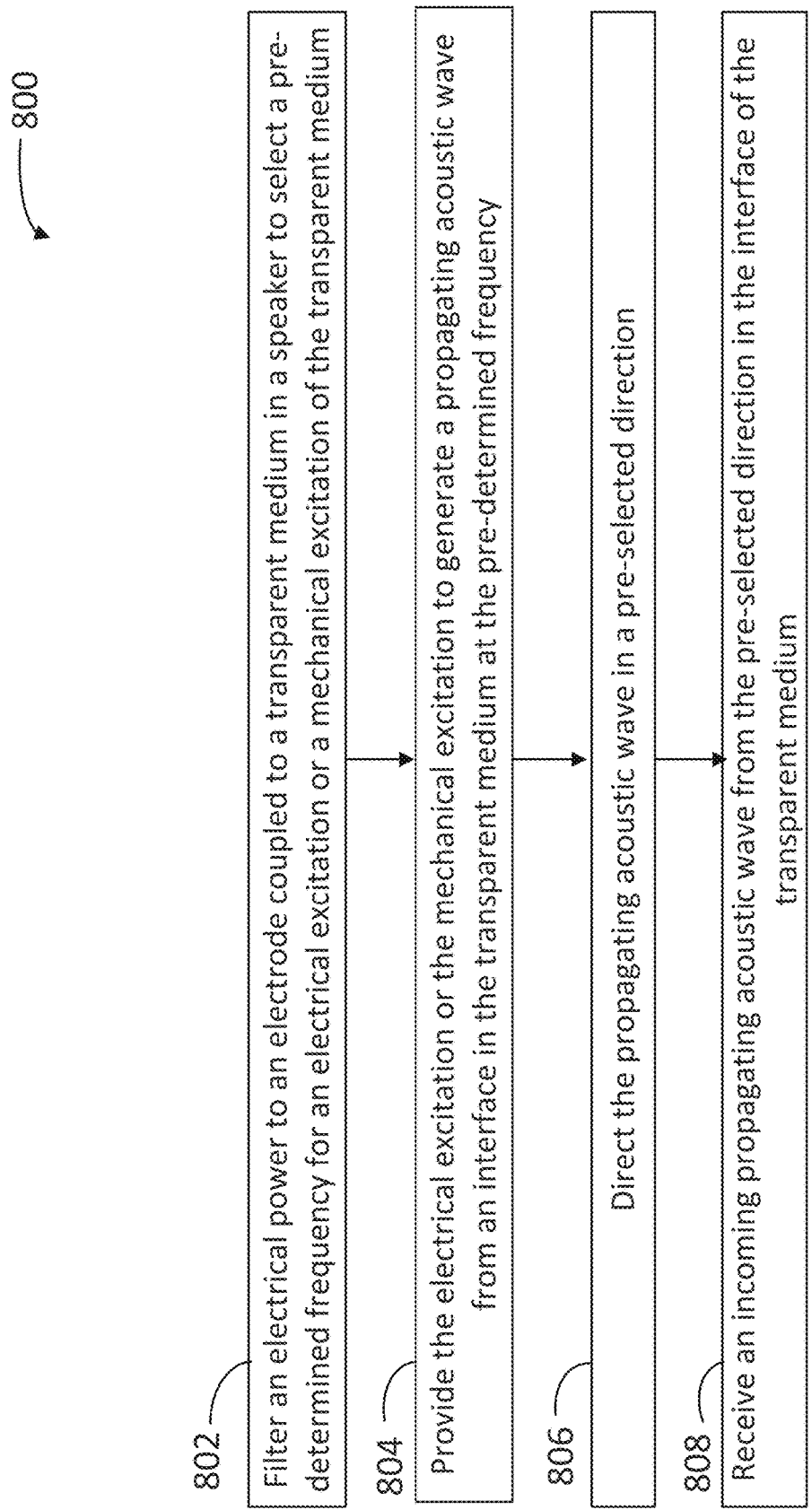
FIG. 8 is a flowchart illustrating steps in a method for generating a propagating acoustic wave using a transparent substrate in a display, window, or lens, according to some embodiments.

FIG. 8 is a flowchart illustrating steps in a method 800 for generating a propagating acoustic wave using a transparent substrate in a display, window, or lens, according to some embodiments. Method 800 may be performed, at least partially, by a processor circuit executing instructions stored in a memory circuit in a mixed reality device, a smart frame, a display, a window, or a lens, as disclosed herein (cf. memory circuit 12 and processor circuit 20, mixed reality device 10A, smart frame device 10B, TV display 30A, eyeglasses 450, store window 615, and windshields 715). The devices may include an optical substrate and a transparent medium forming a transparent transducer, configured to provide or receive a propagating acoustic wave or an acoustic beam at a pre-determined frequency and in a pre-selected direction (e.g., transparent speakers 100, 300, 400, 600, 700A, and transparent ultrasonic transducers 200, 700B). Embodiments consistent with the present disclosure may include methods having at least one or more of the steps in method 800 performed in a different order, simultaneously, quasi-simultaneously, or overlapping in time.

Step 802 includes filtering an electrical power to an electrode coupled to a transparent medium in a speaker to select the pre-determined frequency for an electrical excitation or a mechanical excitation of the transparent medium.

Step 804 includes providing the electrical excitation or the mechanical excitation to generate a propagating acoustic wave from an interface in the transparent medium at the pre-determined frequency.

Step 806 includes directing the propagating acoustic wave in the pre-selected direction. In some embodiments, step 806 includes scanning a surface of a nearby object to identify a distance, a shape, or a consistency of the nearby object. In some embodiments, step 806 includes combining a first acoustic wave from the transparent medium and a second acoustic wave from the transparent medium, the first acoustic wave and the second acoustic wave having the pre-determined frequency and separated by a phase selected based on a source point of the first acoustic wave, a source point of the second acoustic wave, and the pre-selected direction.

Step 808 includes receiving an incoming propagating acoustic wave from the pre-selected direction in the interface of the transparent medium. In some embodiments, step 808 includes generating a warning when the incoming propagating acoustic wave is indicative of a nearby object that has moved into an unsafe position.

Hardware Overview

Figure 9:
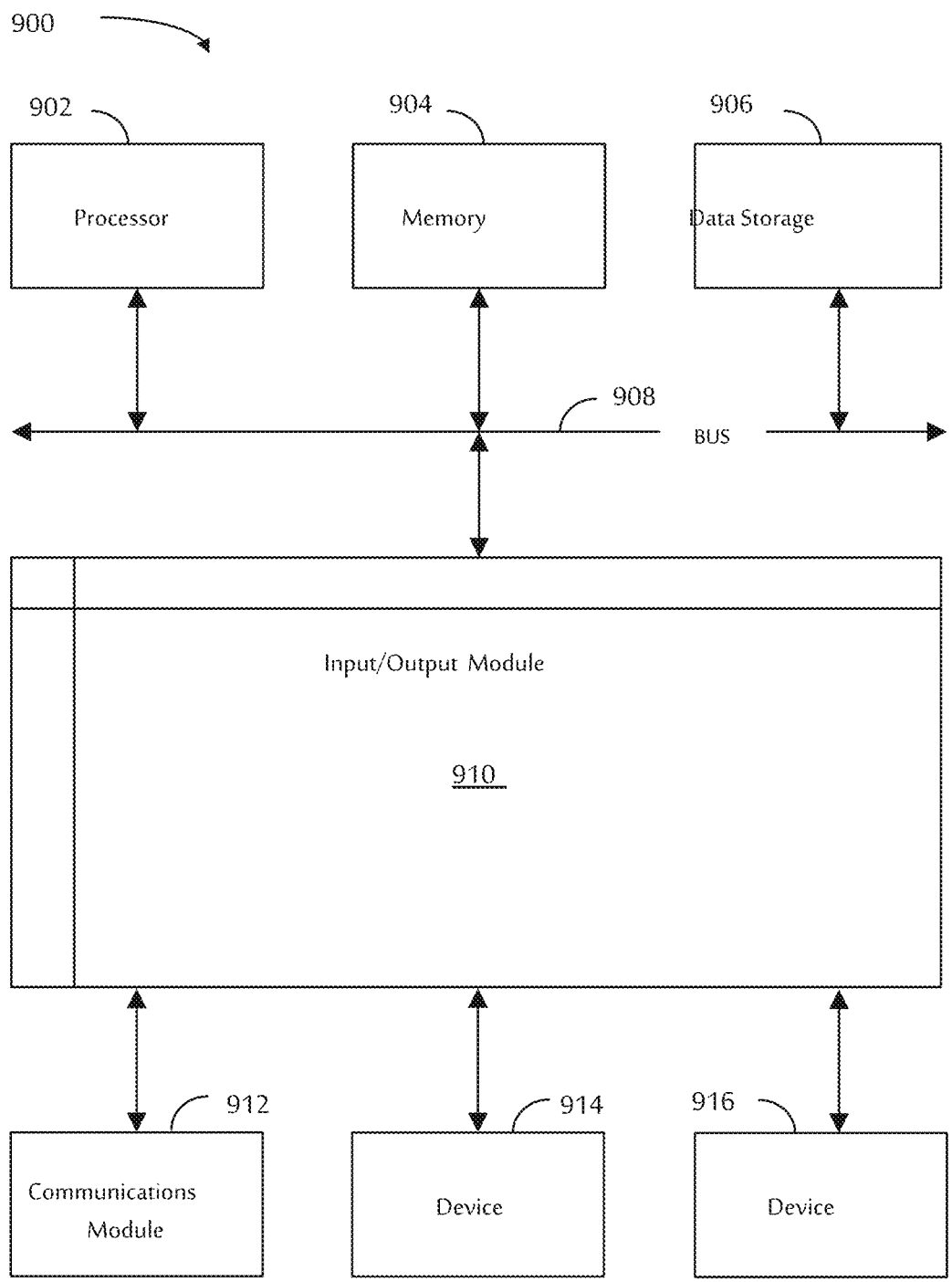
FIG. 9 is a block diagram illustrating a computer system configured to perform at least some of the steps in methods disclosed herein.

FIG. 9 is a block diagram illustrating an exemplary computer system 900 with which the devices of FIGS. 1-6 (e.g., mixed reality devices, smart frames 10A, 10B, TV displays 30, store window 600 and car windows), and the method of FIG. 8 can be implemented. In certain aspects, the computer system 900 may be implemented using hardware or a combination of software and hardware, either in a dedicated server, or integrated into another entity, or distributed across multiple entities.

Computer system 900 includes a bus 908 or other communication mechanism for communicating information, and a processor 902 (e.g., processor circuit 20) coupled with bus 908 for processing information. By way of example, the computer system 900 may be implemented with one or more processors 902. Processor 902 may be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable entity that can perform calculations or other manipulations of information.

Computer system 900 can include, in addition to hardware, a code that creates an execution environment for the computer program in question, e.g., code that constitutes processor firmware, a protocol stack, a database management system, an operating system, or a combination of one or more of them stored in an included memory 904 (e.g., memory circuit 12), such as a Random Access Memory (RAM), a flash memory, a Read-Only Memory (ROM), a Programmable Read-Only Memory (PROM), an Erasable PROM (EPROM), registers, a hard disk, a removable disk, a CD-ROM, a DVD, or any other suitable storage device, coupled to bus 908 for storing information and instructions to be executed by processor 902. The processor 902 and the memory 904 can be supplemented by, or incorporated in, a special purpose logic circuitry.

The instructions may be stored in the memory 904 and implemented in one or more computer program products, i.e., one or more modules of computer program instructions encoded on a computer-readable medium for execution by, or to control the operation of, the computer system 900, and according to any method well-known to those skilled in the art, including, but not limited to, computer languages such as data-oriented languages (e.g., SQL, dBase), system languages (e.g., C, Objective-C, C++, Assembly), architectural languages (e.g., Java, .NET), and application languages (e.g., PHP, Ruby, Perl, Python). Instructions may also be implemented in computer languages such as array languages, aspect-oriented languages, assembly languages, authoring languages, command line interface languages, compiled languages, concurrent languages, curly-bracket languages, dataflow languages, data-structured languages, declarative languages, esoteric languages, extension languages, fourth-generation languages, functional languages, interactive mode languages, interpreted languages, iterative languages, list-based languages, little languages, logic-based languages, machine languages, macro languages, metaprogramming languages, multiparadigm languages, numerical analysis, non-English-based languages, object-oriented class-based languages, object-oriented prototype-based languages, off-side rule languages, procedural languages, reflective languages, rule-based languages, scripting languages, stack-based languages, synchronous languages, syntax handling languages, visual languages, wirth languages, and xml-based languages. Memory 904 may also be used for storing temporary variable or other intermediate information during execution of instructions to be executed by processor 902.

A computer program as discussed herein does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network. The processes and logic flows described in this specification can be performed by one or more programmable processors executing one or more computer programs to perform functions by operating on input data and generating output.

Computer system 900 further includes a data storage device 906 such as a magnetic disk or optical disk, coupled to bus 908 for storing information and instructions. Computer system 900 may be coupled via input/output module 910 to various devices. Input/output module 910 can be any input/output module. Exemplary input/output modules 910 include data ports such as USB ports. The input/output module 910 is configured to connect to a communications module 912. Exemplary communication modules 912 include networking interface cards, such as Ethernet cards and modems. In certain aspects, input/output module 910 is configured to connect to a plurality of devices, such as an input device 914 and/or an output device 916. Exemplary input devices 914 include a keyboard and a pointing device, e.g., a mouse or a trackball, by which a user can provide input to the computer system 900. Other kinds of input devices 914 can be used to provide for interaction with a user as well, such as a tactile input device, visual input device, audio input device, or brain-computer interface device. For example, feedback provided to the user can be any form of sensory feedback, e.g., visual feedback, auditory feedback, or tactile feedback, and input from the user can be received in any form, including acoustic, speech, tactile, or brain wave input. Exemplary output devices 916 include display devices, such as an LCD (liquid crystal display) monitor, for displaying information to the user.

According to one aspect of the present disclosure, mixed reality device 10A can be implemented using a computer system 900 in response to processor 902 executing one or more sequences of one or more instructions contained in memory 904. Such instructions may be read into memory 904 from another machine-readable medium, such as data storage device 906. Execution of the sequences of instructions contained in main memory 904 causes processor 902 to perform the process steps described herein. One or more processors in a multi-processing arrangement may also be employed to execute the sequences of instructions contained in memory 904. In alternative aspects, hard-wired circuitry may be used in place of or in combination with software instructions to implement various aspects of the present disclosure. Thus, aspects of the present disclosure are not limited to any specific combination of hardware circuitry and software.

Various aspects of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. The communication network can include, for example, any one or more of a LAN, a WAN, the Internet, and the like. Further, the communication network can include, but is not limited to, for example, any one or more of the following network topologies, including a bus network, a star network, a ring network, a mesh network, a star-bus network, tree or hierarchical network, or the like. The communication modules can be, for example, modems or Ethernet cards.

Computer system 900 can include clients and servers. A client and server are generally remote from each other and typically interact through a communication network. The relationship of client and server arises by virtue of computer programs running on the respective computers and having a client-server relationship with each other. Computer system 900 can be, for example, and without limitation, a desktop computer, laptop computer, or tablet computer. Computer system 900 can also be embedded in another device, for example, and without limitation, a mobile telephone, a PDA, a mobile audio player, a Global Positioning System (GPS) receiver, a video game console, and/or a television set top box.

The term "machine-readable storage medium" or "computer-readable medium" as used herein refers to any medium or media that participates in providing instructions to processor 902 for execution. Such a medium may take many forms, including, but not limited to, non-volatile media, volatile media, and transmission media. Non-volatile media include, for example, optical or magnetic disks, such as data storage device 906. Volatile media include dynamic memory, such as memory 904. Transmission media include coaxial cables, copper wire, and fiber optics, including the wires that include bus 908. Common forms of machine-readable media include, for example, floppy disk, flexible disk, hard disk, magnetic tape, any other magnetic medium, CD-ROM, DVD, any other optical medium, punch cards, paper tape, any other physical medium with patterns of holes, a RAM, a PROM, an EPROM, a FLASH EPROM, any other memory chip or cartridge, or any other medium from which a computer can read. The machine-readable storage medium can be a machine-readable storage device, a machine-readable storage substrate, a memory device, a composition of matter effecting a machine-readable propagated signal, or a combination of one or more of them.

As used herein, the phrase "at least one of" preceding a series of items, with the terms "and" or "or" to separate any of the items, modifies the list as a whole, rather than each member of the list (i.e., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

To the extent that the term "include," "have," or the like is used in the description or the claims, such term is intended to be inclusive in a manner similar to the term "comprise" as "comprise" is interpreted when employed as a transitional word in a claim. The word "exemplary" is used herein to mean "serving as an example, instance, or illustration." Any embodiment described herein as "exemplary" is not necessarily to be construed as preferred or advantageous over other embodiments.

A reference to an element in the singular is not intended to mean "one and only one" unless specifically stated, but rather "one or more." All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products. Other variations are within the scope of the following claims.

What is claimed is:

1. A transducer, comprising:
a substrate configured to be deposited on a solid object;
a transparent medium coupled to the substrate and configured to oscillate at a pre-selected frequency upon receipt of an electrical excitation or a mechanical excitation and to provide a first acoustic wave; and
an actuator configured to receive an electrical power, and to provide the electrical excitation or the mechanical excitation to the transparent medium, wherein at least a portion of the solid object is viewable through the transparent medium, and the first acoustic wave is at least partially transmitted through an interface of the transparent medium, wherein the first acoustic wave is an ultrasonic pulse configured to scan a shape and a consistency of an object in close proximity to the transducer.

2. The transducer of claim 1, wherein the transparent medium comprises a piezoelectric material.

3. The transducer of claim 1, wherein the pre-selected frequency is within a human audible spectrum comprising a range from 20 hertz to 20 kilo-hertz.

4. The transducer of claim 1, wherein the transparent medium is configured to oscillate in a pre-selected mode of oscillation upon receipt of the electrical excitation or mechanical excitation based on a shape of the transparent medium and a geometrical disposition of the actuator.

5. The transducer of claim 1, wherein the ultrasonic pulse has a pre-selected frequency between about 20 kHz to about one MHz, the ultrasonic pulse further configured to scan a shape and a consistency of an object in close proximity to the transducer.

6. The transducer of claim 1, further configured to provide a second acoustic wave and to form an acoustic beam propagating in a selected direction by combining the first acoustic wave with the second acoustic wave.

7. The transducer of claim 1, further configured to provide a second or more acoustic waves and to form a stereophonic sound that is complementary to an image in the solid object with the first acoustic wave and the second or more acoustic waves.

8. The transducer of claim 1, wherein the substrate is part of any one of a window, a car window, a traffic sign, a computer monitor, a mobile device screen, an eyeglass, or an eyepiece of an augmented reality device.

9. The transducer of claim 1, wherein the interface of the transparent medium is a fluid interface, a solid interface or a plasma interface.

10. A device, comprising:
a frame;
a display mounted on the frame, the display comprising a substrate configured to be deposited on a solid object;
a power circuit configured to provide an electrical power;
an actuator configured to receive the electrical power, and to provide an electrical excitation or a mechanical excitation; and
a transducer, comprising:
a transparent medium coupled to the substrate and configured to oscillate at a pre-selected frequency in response to the electrical excitation or mechanical excitation, to provide a first acoustic wave, wherein at least a portion of the solid object is viewable through the transparent medium, and the first acoustic wave is at least partially transmitted through an interface of the transparent medium, wherein the frame is configured to fit in a physical feature of a user, and wherein the first acoustic wave is an ultrasonic pulse configured to perform a scan of the physical feature of the user.

11. The device of claim 10, further comprising a memory storing multiple instructions and a processor circuit configured to execute the instructions to cause the actuator to provide the electrical excitation or the mechanical excitation at the pre-selected frequency and with a pre-selected phase.

12. The device of claim 10, wherein the actuator is configured to provide the electrical excitation or the mechanical excitation at the pre-selected frequency and with a pre-selected phase.

13. The device of claim 10, further comprising a filter coupled with the power circuit to select the pre-selected frequency from the electrical power.

14. The device of claim 10, further comprising a processor circuit to determine a position of the frame relative to the physical feature of the user based on the scan of the physical feature of the user.

15. The device of claim 10, wherein the solid object comprises a display configured to provide an image to an audience, further configured to provide a second acoustic wave and to form an acoustic beam propagating in a selected direction by combining the first acoustic wave with the second acoustic wave.

16. The device of claim 10, wherein the solid object comprises a display configured to provide an image to an audience, further configured to provide a second acoustic wave and to form a stereophonic sound to the audience that is complementary to the image with the first acoustic wave and the second acoustic wave.

* * * * *